(12) United States Patent  (10) Patent No.: US 7,763,936 B2
Santangelo et al.  (45) Date of Patent: Jul. 27, 2010

(54) LATERAL MOS DEVICE WITH MINIMIZATION OF PARASITIC ELEMENTS

(75) Inventors: Antonello Santangelo, Belpasso (IT); Salvatore Cascino, Gravina Di Catania (IT); Leonardo Gervasi, Aci S. Antonio (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 11/223,796

(22) Filed: Sep. 8, 2005

(65) Prior Publication Data

US 2006/0054954 A1  Mar. 16, 2006

(30) Foreign Application Priority Data

Sep. 8, 2004  (EP)  ................................. 04425671

(51) Int. Cl.
*H01L 29/94* (2006.01)

(52) U.S. Cl. .................. 257/335; 257/336; 257/340; 257/346; 257/386; 257/773; 257/E29.064; 257/E21.299; 257/E21.434; 257/E21.537; 257/E21.627

(58) Field of Classification Search ......... 257/335–336, 257/340, 346, 386, E29.299, E29.064, E21.434, 257/E21.627, E21.537, 773
See application file for complete search history.

(56) References Cited

U.S. PATENT DOCUMENTS

| | | | | |
|---|---|---|---|---|
| 5,119,149 A | * | 6/1992 | Weitzel et al. | ............... 257/262 |
| 5,124,781 A | * | 6/1992 | Tashiro | ........................ 257/759 |
| 5,155,563 A | | 10/1992 | Davies et al. | |
| 5,252,848 A | | 10/1993 | Adler et al. | |
| 5,309,025 A | * | 5/1994 | Bryant et al. | ............... 257/784 |
| 5,621,246 A | * | 4/1997 | Motoyama | .................. 257/736 |
| 5,723,822 A | * | 3/1998 | Lien | ............................ 174/250 |
| 5,869,875 A | | 2/1999 | Hebert | |

(Continued)

FOREIGN PATENT DOCUMENTS

WO  WO 00/49663 A  8/2000

OTHER PUBLICATIONS

H. F. F. Jos, Novel LDMOS Structure for 2 GHz High Power Basestation Application, 28th European Microwave Conference, 1998.*

(Continued)

*Primary Examiner*—Eugene Lee
*Assistant Examiner*—Peniel M Gumedzoe
(74) *Attorney, Agent, or Firm*—Lisa K. Jorgenson; Kevin D. Jablonski; Graybeal Jackson LLP (57) ABSTRACT

A lateral MOS device is formed in a body having a surface and is formed by a semiconductor layer of a first conductivity type; a drain region of a second conductivity type, formed in the semiconductor layer and facing the surface; a source region of the second conductivity type, formed in the semiconductor layer and facing the surface; a channel of the first conductivity type, formed in the semiconductor layer between the drain region and the source region and facing the surface; and an insulated gate region, formed on top of the surface over the channel region. In order to improve the dynamic performance, a conductive region extends only on one side of the insulated gate region, on top of the drain region but not on top of the insulated gate region.

15 Claims, 6 Drawing Sheets

U.S. PATENT DOCUMENTS

| | | | | |
|---|---|---|---|---|
| 5,912,490 | A * | 6/1999 | Hebert et al. | 257/340 |
| 5,918,137 | A * | 6/1999 | Ng et al. | 438/454 |
| 5,949,104 | A | 9/1999 | D'Anna et al. | |
| 6,020,617 | A * | 2/2000 | Jos | 257/401 |
| 6,034,415 | A | 3/2000 | Johnson et al. | |
| 6,048,772 | A | 4/2000 | D'Anna | |
| 6,091,110 | A * | 7/2000 | Hebert et al. | 257/340 |
| 6,100,589 | A * | 8/2000 | Tanaka | 257/758 |
| 6,222,229 | B1 * | 4/2001 | Hebert et al. | 257/327 |
| 6,521,923 | B1 * | 2/2003 | D'Anna et al. | 257/288 |
| 6,707,102 | B2 * | 3/2004 | Morikawa et al. | 257/340 |
| 6,818,540 | B2 * | 11/2004 | Saran et al. | 438/612 |
| 6,831,332 | B2 * | 12/2004 | D'Anna et al. | 257/343 |
| 6,838,731 | B1 * | 1/2005 | D'Anna et al. | 257/343 |
| 6,870,219 | B2 * | 3/2005 | Brech | 257/340 |
| 6,879,049 | B1 * | 4/2005 | Yamamoto et al. | 257/786 |
| 2001/0000928 | A1 * | 5/2001 | Lee et al. | 257/786 |
| 2005/0017298 | A1 * | 1/2005 | Xie et al. | 257/336 |
| 2005/0280085 | A1 * | 12/2005 | Babcock et al. | 257/341 |
| 2005/0285189 | A1 * | 12/2005 | Shibib et al. | 257/341 |

OTHER PUBLICATIONS

John R. Gajadharsing, Low Distortion RF-LDMOS Power Transistor for Wireless Communications Base Station Applications, IEEE MTT-S Digest, 2003.*

Sze et al., Physics of Semiconductor Devices, John Wiley & Sons, $3^{rd}$ Ed., 2007, pp. 346-347.*

Y. Tsividis, Operation and Modeling of the MOS Transistor, McGraw-Hill, $2^{nd}$ Ed., 1999, p. 35.*

EPO Search Report from Application No. EP 04 42 5671, dated Feb. 18, 2005.

Article: Low Distortion RF-LDMOS Power Transistor for Wireless Communications Base Station Applications, Jan. 2003.

* cited by examiner

LATERAL MOS DEVICE WITH MINIMIZATION OF PARASITIC ELEMENTS

PRIORITY CLAIM

This application claims priority from European Patent Application No. 04425671.7, filed Sep. 8, 2004, which is incorporated herein by reference.

TECHNICAL FIELD

Embodiments of the present invention refer to a lateral MOS device with minimization of parasitic elements.

BACKGROUND

As is known, dynamic performance at radio frequencies of an active device is frequently penalized by the presence of undesirable parasitic elements that arise from the particular technique employed for implementation. Frequently, performance is limited by regions of the device that are not really active but are indispensable for its fabrication. For example, contact pads, which are necessary for connecting the device to the pins of the package, have reactive components that dissipate towards the substrate, which can affect the integrity of the radio-frequency electrical signal. The same reasoning applies to all the power metallic interconnections connecting a multitude of active regions to one another in order to provide a single power device. These connections can reach lengths of several hundreds of micron and consequently, as the working frequency rises, can manifest, in addition to resistive characteristics, inductive and capacitive components.

In other words, when the dynamic characteristics of an integrated electronic device are to be assessed, it is necessary to evaluate both the characteristics due to the intrinsic active part, which constitutes the very heart of the device, and the ones due to the extrinsic part that performs the accessory functions.

It is moreover known that lateral power MOS devices can be advantageously employed from frequencies of some hundreds of MHz up to frequencies of a few GHz, with power values that range from a few watts to some hundreds of watts. In order to reach the considerable power values required, these devices are normally obtained by parallel connecting a large number of elementary MOS devices. The parasitic elements introduced by the interconnections consequently play an important role and have been dealt with and solved in different ways.

For example, U.S. Pat. No. 5,252,848 describes a structure where, in order to minimize the parasitic capacitance between the gate electrode and the drain electrode, a conductive layer is provided that extends both on top of the gate and at the side thereof, towards the drain and source electrodes.

For the conductive shield to be effective, it should be connected to ground, and its vertical distance from the drain region, formed within the substrate, should be small and in the region of 100-200 nm.

In this patent then, on the one hand, the shield is prolonged laterally as far as the source electrode and is electrically connected thereto; on the other hand, it suggests choosing the thickness of the dielectric arranged between the shield and the drain region, formed within the substrate, as small as possible. However, with this geometry, it is difficult to reduce the distance of the shield from the drain region because, by so doing, the vertical distance between the portion of the shield overlying the gate and the gate would also decrease. Consequently, the parasitic capacitance between gate and ground would increase to the detriment of the dynamic performance of the device.

Furthermore, the portion of the shield that is located on top of the drain region is defined, in the direction of the drain electrode, by a lithographic process, and consequently its lateral extension cannot be controlled accurately. Since, as the working voltage of the device decreases, it is advantageous to reduce the lateral extension of the drain semiconductor region, which is only slightly doped, the horizontal extension of the shield towards the drain metal electrode sets constraints on an efficient reduction of the operating voltage.

Moreover, in the devices of the type considered, there exists the problem of reducing the source parasitic resistance due to the relatively high resistivity of the epitaxial layer that is less doped than the substrate.

According to U.S. Pat. No. 5,155,563, in order to reduce the source parasitic resistance, an enriched region is provided, which extends throughout the depth of the epitaxial layer and reduces the resistance thereof. To obtain diffusion of the dopant to depths sufficient to significantly alter the concentration of the epitaxial layer, so as to bring the minimum concentration of dopant to values higher than approximately $10^{17}$ atoms/cm$^3$, it is necessary to use thermal processes for long periods of time and at high temperatures (T~1150° C. for some hours). In a radio-frequency application, where the device has to stand up to drain voltages of about 70 V, it is necessary for the thickness of the epitaxial layer, at the end of all the thermal processes, not to drop below a few microns. The thickness of the epitaxial layer has a bearing both on the breakdown voltage of the device (Bvdss) and on the capacitance Cds between the drain regions and the underlying semiconductor region that has a doping of an opposite type and is at the lowest potential (ground) and connected to the source. In particular, the capacitance Cds, in particular when the drain electrode is positively biased, may be conveniently reduced by increasing the thickness of the epitaxial layer. Since the substrate contributes to the source resistance, it is not very resistive, and its dopant concentration is unlikely lower than $10^{18}$ atoms/cm$^3$. In these conditions, the thermal process necessary for a dopant species implanted on the surface, such as for example, boron, to sufficiently raise the dopant concentration in a direction of the substrate is quite high. The effect of the diffusion process would not be limited to just the species implanted on the surface but would also involve the substrate, which would diffuse uniformly upwards in the direction of the epitaxial layer, where the concentration is low and is in the region of $10^{15}$ atoms/cm$^3$. To prevent the epitaxial thickness from being reduced excessively it is necessary to grow an initial semiconductor layer, which can be up to approximately three times greater than the final one. The overall result is that the minimum dopant concentration between the surface and the "deep" substrate unlikely exceeds a concentration of $10^{17}$ atoms/cm$^3$. Furthermore, since the final thickness of the epitaxial layer is a fraction of the initial one, any possibly absolute error in the growth stage would be amplified in relation to the smaller final residual thickness, negatively affecting the statistical reproducibility of the depth of the high-resistivity area. The diffusion upwards of the substrate in particular produces a dopant profile that decreases slowly from the substrate towards the surface, and consequently it is difficult to find a satisfactory compromise between breakdown voltage of the MOS, drain/source capacitance Cds, and parasitic resistance of the P+ type connection.

Alternatively, it is possible to employ more complex processes (see, for example, U.S. Pat. Nos. 5,869,875, 5,949,104 and 6,048,772), which, even though, in some cases, they have smaller horizontal dimensions, require opening of a trench, a process of doping, filling with a conductive material, and planarization of the surface. In the case of U.S. Pat. No. 6,048,772, the process of planarization is particularly difficult in view of the fact that the depth of the trench can exceed 2 μm.

Even more complex solutions (U.S. Pat. No. 6,034,415) envisage forming a conductive plug that extends through the entire thickness of the substrate to reach an enriched semiconductor area. The fabrication of the conductive plug involves a complicated photolithographic process that is carried out on the rear surface of the substrate and digging of a trench, which has a depth comparable with the thickness of the substrate.

For problems of thermal dissipation it is convenient to reduce to a minimum the vertical thickness of the device, compatibly with the technological limits imposed by the thickness reduction process, which is frequently linked to the brittleness of the semiconductor wafers. In these conditions, it is extremely difficult to perform a photolithographic process and etching on the rear surface of the wafer and to form a conductive plug. Furthermore, assuming that it is possible to obviate the problems of brittleness and assuming that the final thickness of the device may reach small values in the region of 50 μm, nevertheless particularly burdensome etching processes are involved.

SUMMARY

An embodiment of the invention provides a lateral MOS device having high dynamic performance with an extensive active perimeter and, hence, is useful for achieving high power levels. Advantageously, the lateral MOS device is manufactured without requiring burdensome thermal processes and so as to minimize the parasitic capacitive contributions.

According to an embodiment of the invention, there are provided a lateral MOS device and the manufacturing process thereof.

BRIEF DESCRIPTION OF THE DRAWINGS

For an understanding of the present invention a preferred embodiment is now described, only as a non-limiting example, with reference to the attached drawings.

DETAILED DESCRIPTION

Figure 1:
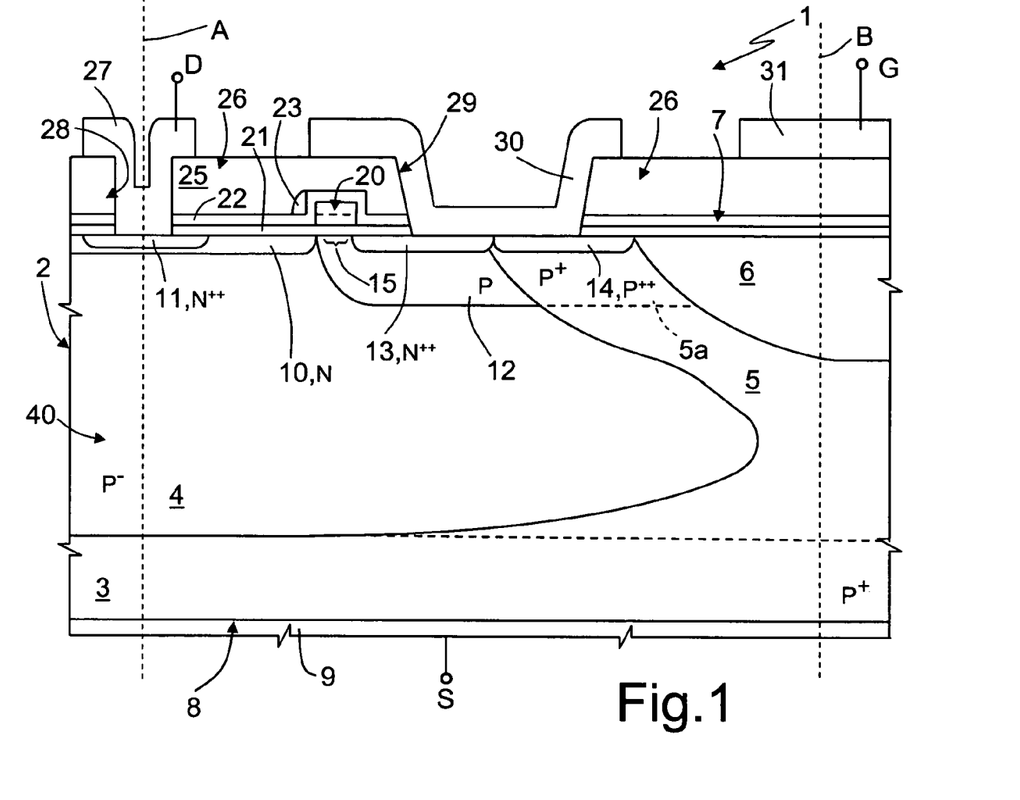
FIG. 1 shows a cross-section through a lateral MOS device according to an embodiment of the invention.

FIG. 1 shows a portion of a power lateral MOS device (LDMOS) for applications in the radio-frequency range. In detail, FIG. 1 represents half of an elementary device (the portion comprised between the axes A and B), and the entire power lateral MOS device can be made up of a plurality of elementary devices. The entire elementary device can be obtained by turning over the structure illustrated about the axis A, while the entire power lateral MOS device can be obtained by replicating a certain number of times the elementary device (in practice, by repeatedly turning an elementary device about the axis B).

The device 1 of FIG. 1 is formed in a body 2 of semiconductor material, comprising a substrate 3, of P+ type, and an epitaxial layer 40. The epitaxial layer 40, having a lower boundary with the substrate 3 partially represented by a dashed line, comprises a resistive region 4, of P− type, and a highly doped region 5, having a doping level equal approximately to the substrate 3. The highly doped region 5 extends from the substrate 3 (from which it is separated by a dashed line) as far as in the proximity of a surface 7 of the body 2, as will be described in detail hereinafter. Furthermore, a dielectric region 6, for example, of silicon oxide, extends laterally with respect to the highly doped region 5.

A source electrode 9 is moreover formed on the rear surface 8 of the substrate 3, connected to a source terminal S.

The epitaxial layer 40 accommodates a drain region 10, of N type, in turn housing a drain contact region 11 of N++ type. A body region 12, of P type, extends adjacent and contiguous to the drain region 10 and houses a source region 13 of N++ type. The surface portion of the body region 12 comprised between the source region 13 and the drain region 10 forms a channel 15.

A substrate contact region 14, of P++ type, is formed within the highly doped region 5, between the source region 13 and the dielectric region 6, and has the purpose of minimizing the contact resistance with the overlying metallization.

A gate region or electrode 20, preferably formed by a polycrystalline silicon layer and by a silicide layer, extends on top of the surface 7, over the channel 15, and is insulated from the body 2 by a gate oxide layer 21. The gate region 20 is surrounded, at the top and on the side surfaces, by a thin dielectric layer 22, for example of silicon oxide. A conductive region 23 extends adjacent to the gate region 20, on top of the drain region 10, throughout the length of the gate region 20, as may be seen in the top view of FIG. 2, which shows the structure of FIG. 1 before forming the metallizations. The conductive region 23 can be formed by N++ doped polycrystalline silicon, by a double polysilicon layer and silicide ($CoSi_2$, $TiSi_2$, $MoSi_2$, PtSi) due to chemical reaction of the polysilicon layer (already shaped) and a transition metal, or by a silicide layer (when the polysilicon layer is completely consumed during the chemical reaction), or by metal (preferably tungsten or titanium nitride).

A thick dielectric layer 25 extends on top of the thin dielectric layer 22 and of the conductive region 23; the layer 25, together with the gate oxide layer 21 and the thin dielectric layer 22, forms an insulating layer, designated as a whole at 26.

The insulating layer 26 covers the entire surface 7 of the body 2 and is open at the contacts. In particular, FIG. 1 shows a drain metallization 27 and a source metallization 30. The drain metallization 27, connected to a drain terminal D, extends within an opening 28 of the top insulating layer 26, on top of and in electrical contact with the drain contact region 11. The source metallization 30 has portions (one of which is visible in FIG. 1) extending within an opening 29 of the insulating layer 26, on top of and in electrical contact with the source region 13 and the substrate contact region 14. Furthermore, a portion of the source metallization 30 extends on top of the insulating layer 26, over the gate region 20, for reasons explained hereinafter.

Finally, a gate metallization 31, connected to a gate terminal G, extends on top of the insulating layer 26, over the dielectric region 6. The gate metallization 31, which extends in a direction orthogonal to the plane of FIG. 1, has, at preset distances, connecting portions, which extend towards the gate region 20 in a per se known manner. Of course, in these areas the source metallization 30 and the corresponding contact are interrupted.

Figure 2:
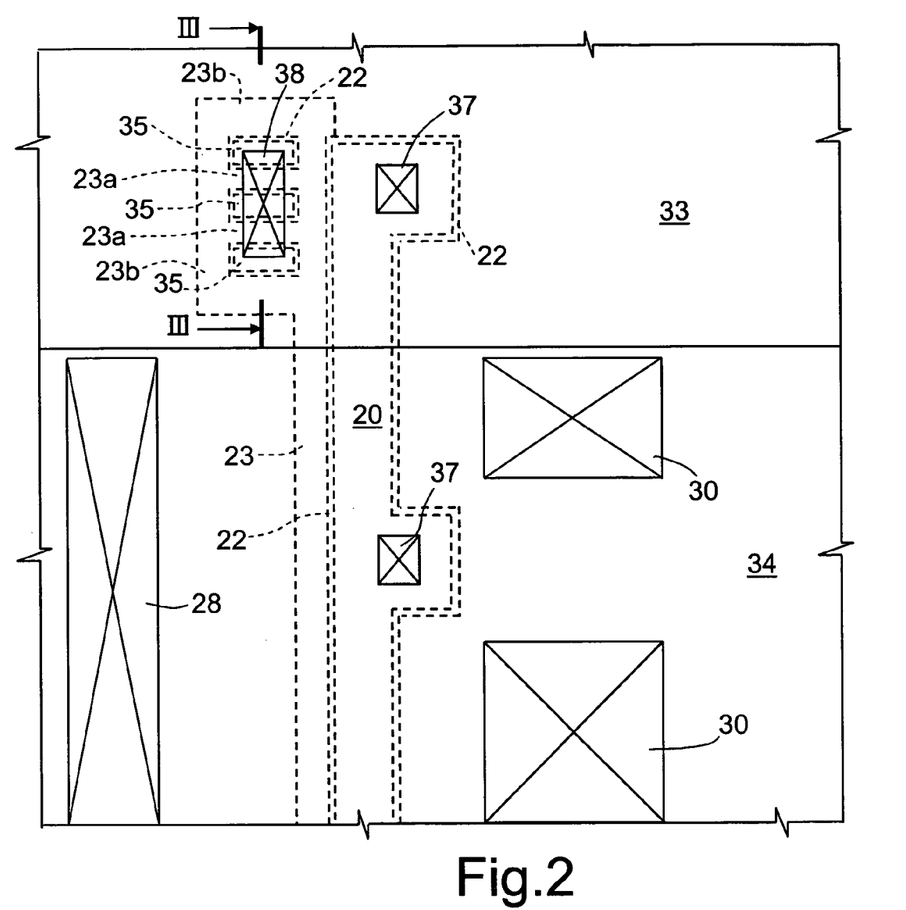
FIG. 2 shows a view from above of the device of FIG. 1.
Figure 3:
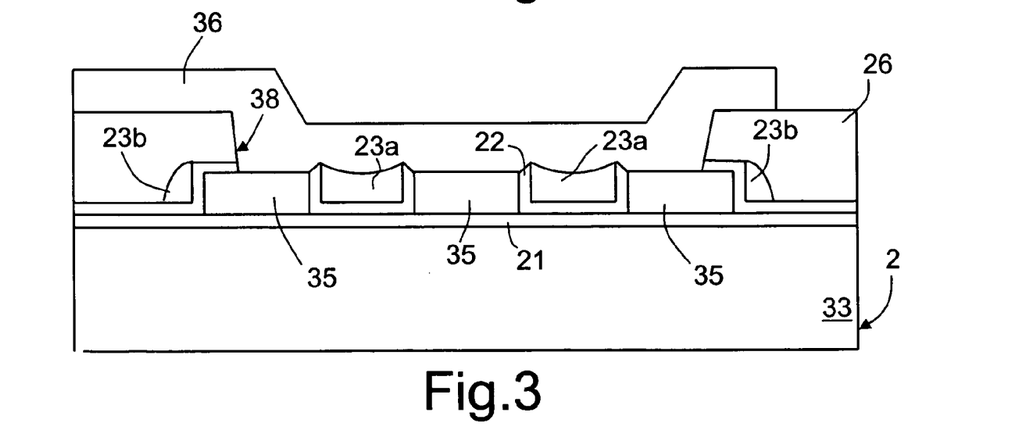
FIG. 3 shows a cross section through a detail of FIG. 2, taken along the line III-III.

FIGS. 2 and 3 show in detail the structure of the electrical connection of the conductive region 23, formed in an area of the body 2 covered by a field-insulation layer 33 surrounding the active area (designated by 34), where the conductive regions 5, 10-15 are formed. In the example shown, the electrical connection structure of the conductive region 23 comprises three projections 35 of polycrystalline silicon, even though just one projection 35 is sufficient, or else two. Interstitial regions 23a, of conductive material, are formed between the projections 35; the interstitial regions 23a are insulated from the projections 35 through the thin dielectric layer 22, electrically connected to a conductive ring 23b surrounding the projections 35 and arranged also between the projections 35 and the gate region 20. The conductive ring 23b (and hence the interstitial regions 23a) are electrically connected and formed by the same material as the conductive region 23. As may be noted, a contact 38 extends on top of the connection structure and connects a biasing metallization 36 to the interstitial regions 23a and then, through the conductive ring 23b, to the conductive region 23.

The shape and dimensions of the projections 35 are purely indicative and can be modified as desired. Advantageously, the distance of the projections 35 from the gate region 20 and possibly between them is chosen so as to obtain planarization of the structure during conformal deposition of the material forming the conductive region 23 and to prevent the removal thereof during the subsequent anisotropic etching, as explained in greater detail hereinbelow.

FIG. 2 further illustrates contacts 37 formed in the thick dielectric layer 25 and enabling contact between the gate region 20 and the gate metallization 31 (not shown).

With the structure of FIG. 1, it is possible to minimize the extrinsic parasitic contributions of a MOS structure and to reduce the phenomena of hot carriers, which the more evident, the higher the working voltages.

In fact, the conductive region 23, by being arranged between the gate region 20 and the entire drain structure, formed by the regions 10, 11 and the metallization 27, reduces the parasitic capacitance between gate and drain (Cgd) and favours depletion of the drain region 10, which is located immediately underneath. Depletion enables a reduction of the electrical field and consequently the generation of hot carriers.

Thanks to the method used for the fabrication of the conductive region 23, its distance between the gate region 20 and the drain region 10 can be appropriately regulated by selecting the thickness of the thin dielectric layer 22 and this distance is unaffected by any alignment error typical of lithographic processes. In turn, the thickness of the thin dielectric layer 22 is no more determined by the need to have a large distance between the gate region 20 and the overlying regions connected electrically to the source region (here the source metallization 30), since the latter distance in this case depends upon another parameter, i.e., upon the thickness of the thick dielectric layer 25. Furthermore, the horizontal dimensions of the conductive region 23 are not established by a lithographic process and may consequently be minimized by reducing the overlapping between the conductive region 23 and the drain region 10.

This enables a better compromise between the control of the electrical field in the drain region 10 near the gate structure 20, the parasitic capacitance Cgd and the slight increase of gate/source capacitance (due to the capacitance between the gate region 20 and the conductive region 23), which occurs when the conductive region 23 is dynamically connected to the source region 13. The latter capacitance (gate 20/conductive region 23) is, however, of a small value considering that the gate surface exposed to the conductive region 23 has an extension proportional to just its thickness and does not involve the top surface of the gate region 20.

For example, the thickness of the thin dielectric layer 22 can be chosen between 100 and 300 nm, the height of the conductive region 23 equal to approximately that of the gate region 20, preferably approximately 400 nm, the width of the conductive region 23 in the horizontal direction, approximately 300 nm, and the thickness of the thick dielectric layer 25 equal to 1.5 μm.

The source metallization 30, which extends on top of the gate region 20, contributes to a further reduction of a possible interaction of electromagnetic type, or more simply of capacitive type, between the drain metallization 27 and the gate region 20. It is important to stress that, with the solution illustrated, the distance between the source metallization 30 and the gate region 20 can be conveniently increased by increasing the thickness of the thick dielectric layer 25, without any loss of the benefits obtainable thanks to the conductive region 23. It is consequently possible to minimize the parasitic capacitance between the source metallization 30 and the gate region 20.

Hereinafter, a manufacturing process will be described, which enables, on the one hand, fabrication of the conductive region 23 to be self-aligned to the gate region 20, and, on the other, fabrication of the highly doped region 5 using extremely advantageous thermal processes.

Figure 4:
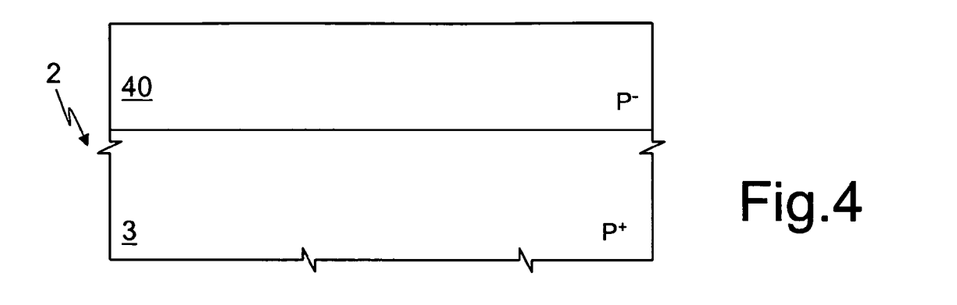
FIGS. 4-8 show cross sections similar to that of FIG. 1 in successive manufacturing steps of the device.

With reference to FIG. 4, the process initially provides a body 2 formed by a substrate 3 of P+ type, and by an epitaxial layer 40 of P− type. For example, the substrate 3 has a concentration of $2*10^{18}$ atoms/cm$^3$, and the epitaxial layer has a concentration $10^{15}$ atoms/cm$^3$.

Figure 5:
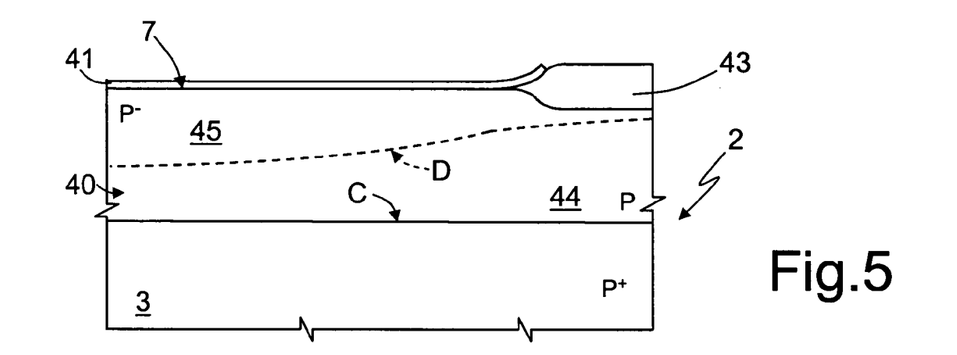

Next, as shown in FIG. 5, a first mask 41, for example of silicon nitride, is formed on top of the surface 7 of the epitaxial layer 40 and covers the entire surface 7 except for the uncovered areas (just one of which is illustrated in the figures, to which reference will be made in the ensuing description). Using the first mask 41, thermal oxidation is carried out and causes the growth of a sacrificial region 43, of oxide, at the exposed area (LOCOS-Local Oxidation technique). The sacrificial region 43 can have a thickness of up to approximately 2 μm. As a result of the thermal growth of the sacrificial region 43, in the proximity thereof there is an increase in the diffusiveness of the dopant on account of the phenomenon known as oxidation-enhanced diffusion (OED). This results in a localized diffusion upwards of the dopant present in the substrate 3 underneath the sacrificial region 43. This phenomenon is highlighted in FIG. 4 by the lines C and D, which represent the locus of the points with a concentration of $2*10^{18}$ atoms/cm$^3$ and $3*10^{15}$ atoms/cm$^3$, respectively. Said diffusion upwards favours obtaining high concentrations of dopant in the area (designated by 44) of the epitaxial layer 40 underneath the sacrificial region 43; the top portion of the epitaxial layer 40, designated by 45, remains at a lower dopant concentration.

Figure 6:
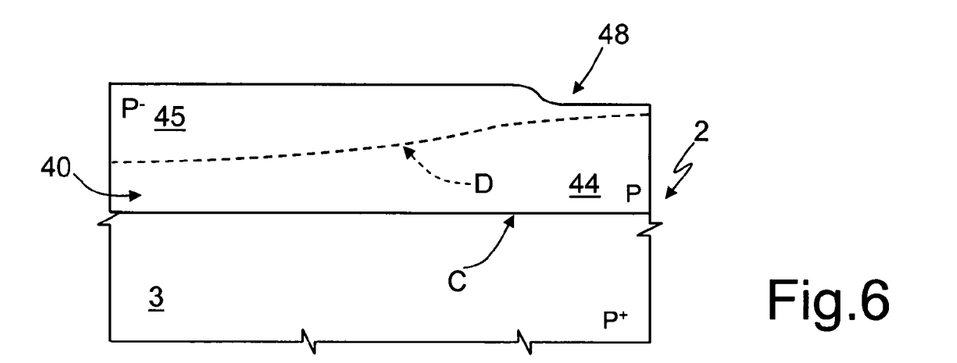

Next, as shown in FIG. 6, both the first mask 41 and the sacrificial region 43 are removed. Consequently, the surface 7 of the body 2 has a depression 48 in the area previously occupied by the sacrificial region 43, which, as compared to the original surface, can reach a depth of approximately 1 µm. This dimension is approximately one half the thickness of the sacrificial region 43.

Figure 7:
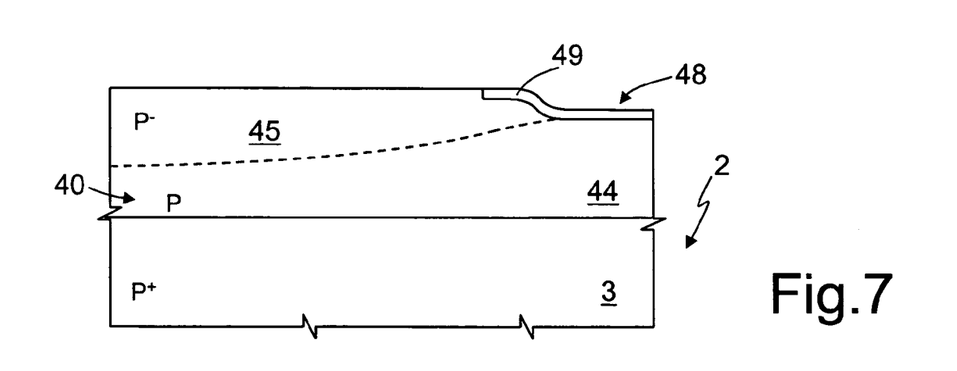

Then, as shown in FIG. 7, oxidation is carried out, which leads to the growth of a thin oxide layer (not shown, having a thickness of approximately 25 nm) and a masked implantation of dopant of P type, for example of boron, is carried out so as to confine horizontally the implant in the portion substantially corresponding to the depression 48, as illustrated by the implanted layer 49. The presence of the depression 48 enables localization of the majority of the implanted layer 49 at a depth, with respect to the original surface, of approximately 1 µm, without the need to employ high implantation energies. To obtain the same effect in the absence of the depression 48 it would have been necessary to employ quite high implantation energies in the region of 0.5 MeV, which are unlikely to be achievable with high doses in normal commercially available ion-implantation equipment.

Should the implantation energy not constitute a technological constraint, the presence of the depression 48 in any case enables localization of the implanted layer 49 at greater depths, and in any case energies in the region of a hundred KeV are sufficient to reduce segregation of the dopant within the subsequent oxide layer, as will emerge more clearly hereinafter.

Figure 8:
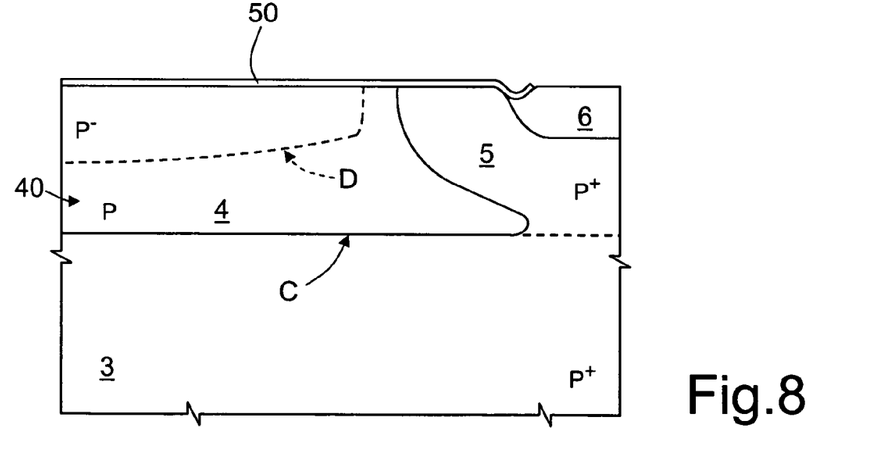

Next, as shown in FIG. 8, a second mask 50 is formed, which is also, for example, of nitride and is shaped approximately like the first mask 41. Via a further thermal process the dielectric region 6 is then grown. Since, as is indicated, implantation of the implanted layer 49 has been obtained at a certain depth from the surface, there will be a reduced segregation of the dopant in the oxide of the dielectric region 6 during its growth. Furthermore, in the semiconductor regions where the implanted layer 49 extends horizontally beyond the region 48, segregation will be further reduced because they are further away from the portion of semiconductor that will be oxidized next. If the thickness grown is equal to that of the sacrificial region 43, the surface 7 is planarized. Furthermore, as a result of OED, the implanted species reaches easily, in view of the considerable diffusiveness, great depths, forming the highly doped region 5 that surrounds, at the bottom, the dielectric region 6 and reaches the substrate 3. Also in FIG. 8, the lines C and D show the locus of the points with concentrations of $2*10^{18}$ atoms/cm$^3$ and $3*10^{15}$ atoms/cm$^3$, respectively. In practice, the resistive region 4 illustrated in FIG. 1 (in which the line D and the boundary between the resistive portion 4 and the highly doped region 5 corresponds approximately to the line C is no longer illustrated) has a profile of doping that decreases starting from the substrate 3 upwards.

In the same way as illustrated for the dielectric region 6, it is possible to obtain insulation of all the structures outside the active region, for example, the field-insulation region 33 of FIG. 2. Furthermore, the process thus devised produces a very planarized surface 7, which prevents all the problems of photolithographic definition (notching) of the gate region 20 when this passes from the active area 34 to the field-insulation region 33 (FIG. 2).

Figure 9:
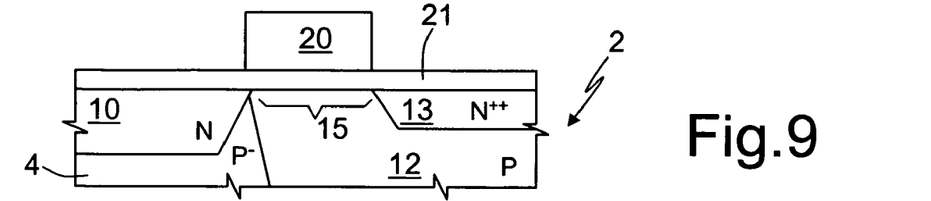
FIGS. 9, 10, 11A, 12A, 13, 14 show cross-sections similar to FIG. 1, for a detail of the device, in successive manufacturing steps.

After removal of the mask, as shown in FIG. 9, the gate oxide layer 21, the gate region 20 and regions 10 are formed using known techniques, such that channel region 15 is adjacent to drain region 10 and extends under the entire length of gate region 20. During the definition of the gate region 20, the projections 35 are also formed (FIGS. 2 and 3).

Figure 10:
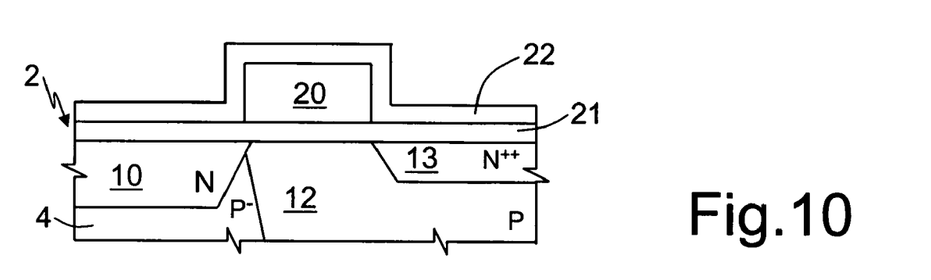
Figure 11A:
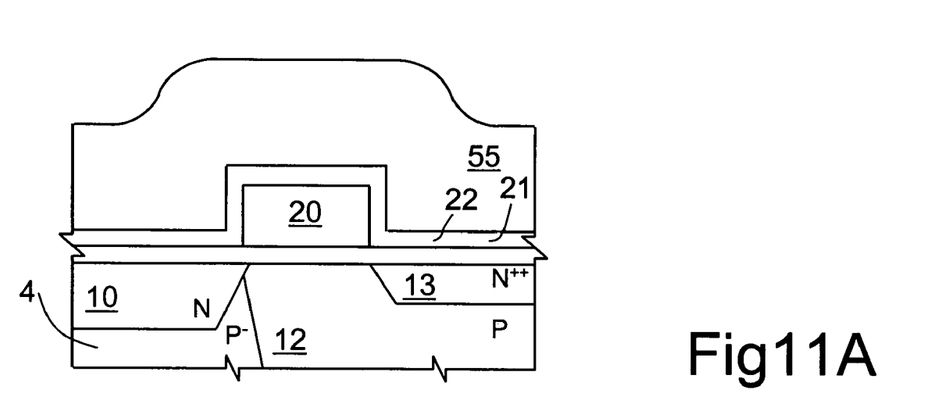
Figure 11B:
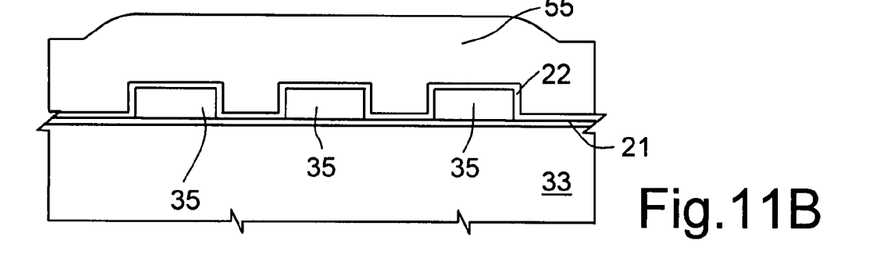
FIGS. 11B and 12B show cross-sections of the detail of FIG. 3, in the same manufacturing steps as FIGS. 11A and 12A.

Then, as shown in FIG. 10, the thin dielectric layer 22 is deposited, and, as shown in (FIGS. 11A and 11B, a conductive layer 55, of doped polysilicon or metal, is deposited.

Figure 12A:
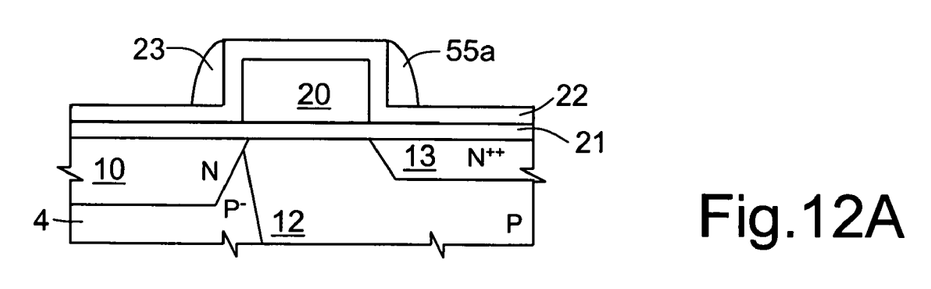
Figure 12B:
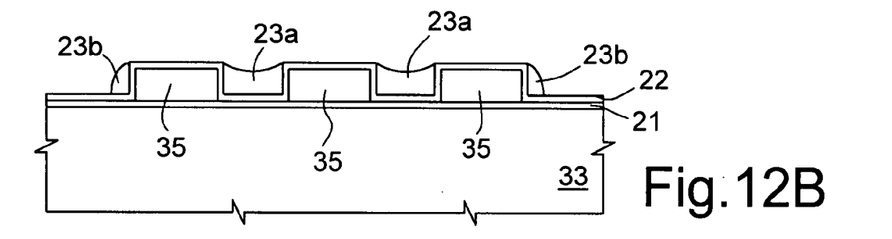

Next, as shown in FIGS. 12A and 12B, the conductive layer 55 is etched anisotropically without using masks and remains only on the sides of the gate region 20, forming the conductive region 23 on top of the drain region 10, a spacer region 55a on the opposite side, as well as intermediate portions (not shown). Furthermore, the conductive layer 55 forms the interstitial regions 23a and the conductive ring 23b, which is formed as extension of the conductive region 23. In fact, as indicated above, by choosing appropriately the dimensions and the shape of the projections 35, the conductive layer 55 is not removed from the gaps present between the projections 35 (where it forms the interstitial regions 23a) and between the projections 35 and the gate region 20, guaranteeing the electrical connection between the interstitial portions 23a and the conductive region 23.

Figure 13:
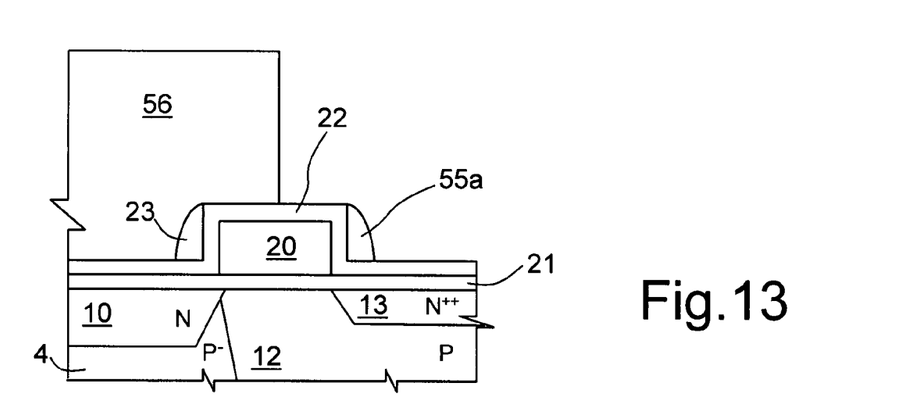

Next, as shown in FIG. 13, using a suitably designed mask 56, which covers the conductive region 23, the interstitial regions 23a and the conductive ring 23b, the spacer region 55a is removed from top of the source region 13 and from the other portions of the perimeter of the gate region 20.

Figure 14:
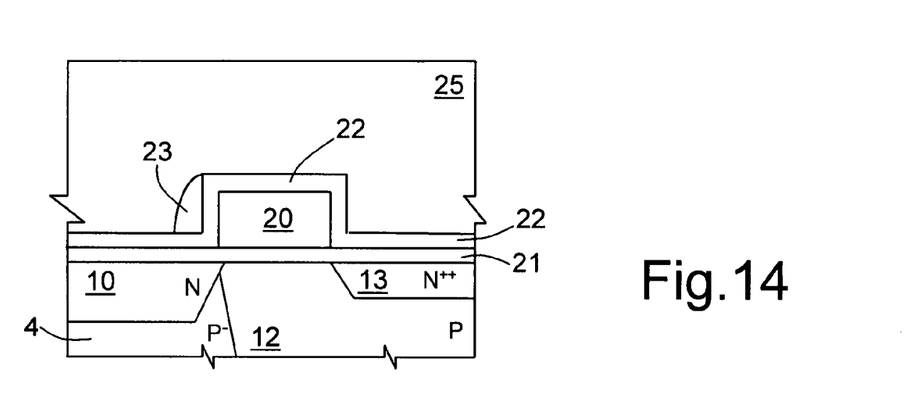

Then, the dielectric layer 25 is deposited and planarized, as shown in FIG. 14. The contacts are opened (openings 28, 29, 37 and 38), the metallic material that is to form the drain metallization 27, the source metallization 30, the gate metallization 31, and the biasing metallization 36 is deposited and then defined. In addition, the source electrode 9 is formed.

Finally, all the processes necessary for finishing the device are carried out in a per se known manner.

The advantages obtainable with the device described are evident from the foregoing description.

In particular, it is emphasized that the device is suited to obtaining a large perimeter of active channel (several centimetres), which is advantageous in the particular case of a power lateral MOS structure (LDMOS) for applications in the radio-frequency range.

Furthermore, the horizontal dimension and the position of the conductive region 23 can be determined without resorting to a photolithographic process. Therefore, the conductive region 23 can extend exactly on the side wall of the gate region 20 right up against the thin dielectric layer 22 and have a minimum extension above the drain region 10.

The dielectric region 6 of FIG. 1, in addition to enabling a reduction in the parasitic capacitance between the gate metallization 31 and the substrate 3, enables forming the highly doped region 5 using extremely advantageous thermal processes. The gate metallization 31 advantageously reduces the resistance Rg, improving the dynamic performance of the device when the active perimeter of the elementary cell in the direction orthogonal to the plane of FIG. 1 exceeds some tens of micron.

When this dimension reaches and exceeds a hundred micron the limits imposed by the degenerative phenomenon of electromigration impose constraints on the minimum useful cross-section of metal necessary to form the interconnections. Since, in general, an increase in the thickness of the metal interconnections is accompanied, for technological limitations, by an increase in the minimum horizontal dimensions, it is evident that this solution would also entail an increase in the horizontal dimensions of the drain metallization 27. Within certain limits the current density would thus be reduced, but also the distance between the drain metallization 27 and the source metallization 30 would be reduced, and the area that the two regions expose to one another would increase, with a consequent increase in the drain/source capacitance Cds. In order to evaluate this phenomenon it is to be considered that, in the devices having drain-source breakdown voltages $BV_{DSS}$ (i.e., the breakdown voltage of the junction 10/11 with short-circuited gate) of about 70 V, the distance between the gate region 20 and the drain contact region 11 is close to 3 μm. In case of devices operating at lower voltages, this distance can be conveniently reduced, further aggravating the problems. The horizontal dimension of the drain metallization 27 must consequently be contained, and this consideration can also be extended to the horizontal dimensions of the drain contact region 11. This region has the purpose of minimizing the electrical resistance between the drain metallization 27 and the drain region 10, but constitutes a part of the total drain area facing the epitaxial layer 4 and must be minimized, to advantage of the Cds, by reducing the dimensions of the opening 28. For solving these problems and containing the parasitic capacitance Cgd between gate and drain it is possible to use the structure illustrated in FIG. 15.

Figure 15:
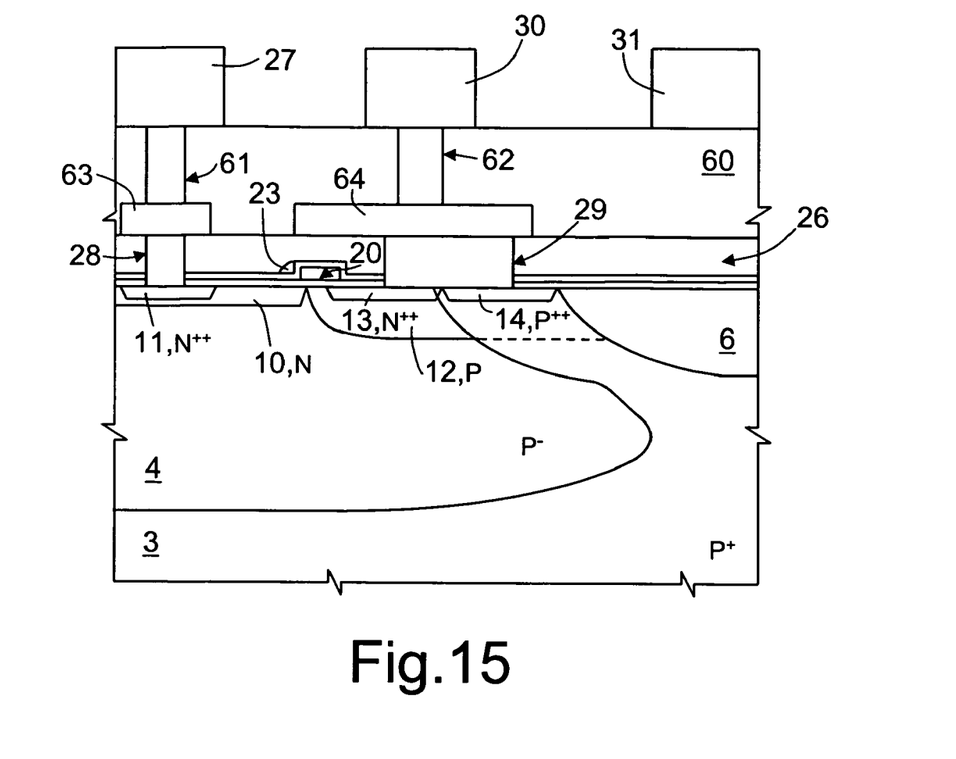
FIG. 15 shows a variation of the device of FIG. 1.

In FIG. 15, the drain metallization 27 and the gate metallization 31 extend at a second metallization level, forming two conductive paths, designated once again by 27, 31. Since a device, made with just one metallization level and with an active perimeter of approximately 6 cm, typically has, at drain voltages Vds higher than 20 V, a capacitance Cgd of the order of 1-2 pF, it is evident that the parasitic capacitance that would be set up between the two conductive paths, namely the drain path 27 and the gate path 31, would contribute to increasing significantly the Cgd. In fact, two conductive paths of a thickness of approximately 4 μm and arranged at a distance of approximately 8 μm apart would have, for the perimeters considered, a capacitance of almost 1 pF. This value would increase the Cgd by approximately 50%. Between the drain metallization 27 and gate metallization 31 there is then inserted a further metal path (designated once again by 30), which is connected to a source metal contact region 64 and does not have the purpose of carrying the current of the device but serves to minimize the capacitive coupling, or more in general electromagnetic coupling, between the gate metallization 31 and the drain metallization 27. The second metallization level is obtained after interposition of a second insulating layer 60, which can conveniently have a relative dielectric constant lower than that of silicon oxide, using, for example, materials with low dielectric constant, in order to minimize all the capacitances between the various metal electrodes. Both the drain path 27 and the source path 30 are connected to the respective drain region 11 and source region 13 through vias 61, 62 and metal contact regions 63, 64, formed in the first metallization level. In particular, the source metal contact region 64 extends until it covers the gate region 20. For reducing the dimensions of the opening 28, and consequently the horizontal dimensions of the drain region 11 and favouring planarization of the first level of metal by filling the openings 28 and 29, tungsten is advantageously used, which could also be used for providing entirely the first metal level. In particular, the source contact is obtained using a multitude of small openings 29, of dimensions such as to allow filling with tungsten. The openings 29 are arranged regularly in an orthogonal direction to the plane of FIG. 15 and have the horizontal dimension, which lies on the plane of FIG. 15, sufficient to provide an electrical contact with the regions 13 and 14. The tungsten can also be used for filling the vias 61, 62 (tungsten plug) and enables fabrication of the second insulating layer 60 of large thickness in a way compatible with materials having a low dielectric constant. Alternatively, the conductive paths 27, 30 and 31 can conveniently be obtained by electrochemical deposition of metals with high conductivity and high resistance to electromigration phenomena, such as, for example, gold. The latter metal, being able to carry greater current density than more conventional metallizations and thanks to the high thicknesses that can be achieved, can enable a better compromise between the horizontal dimensions of the conductive paths 27, 30, 31, the active perimeter of the elementary cell, and the maximum temperature at which the device can operate, ensuring an acceptable operating life.

Figure 16:
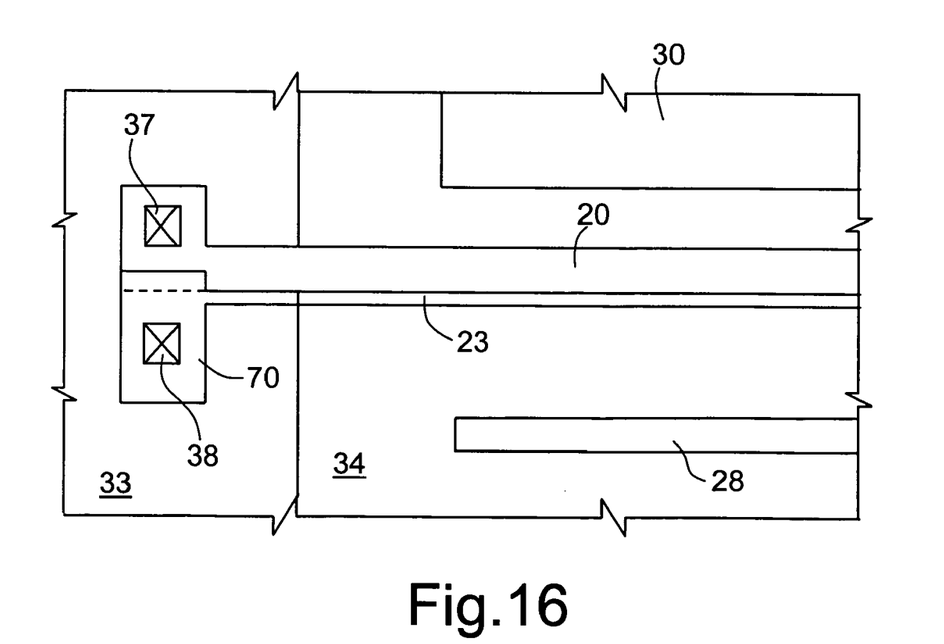
FIG. 16 shows a variation of the layout of FIG. 2.

It should be noted that the contact structure of the conductive region 23 can differ from the one illustrated in FIGS. 2 and 3. For example, FIG. 16 shows a solution wherein the conductive region 23 has, at its end on top of the field-insulation region 33, a widened portion 70, which overlaps slightly the gate region 20. This widened portion 70 can be defined photolithographically using a specially designed mask that protects it during anisotropic etching when forming the conductive region 23 and the spacer region 55a (FIG. 13) and during removal of the spacer region 55a. The contact 38 is then formed on top of the widened portion 70.

Referring to FIG. 1, the device 1 may be disposed in an integrated circuit (IC), which may be part of a larger system such as a computer system.

From the foregoing it will be appreciated that, although specific embodiments of the invention have been described herein for purposes of illustration, various modifications may be made to the device and to the process of fabrication without deviating from the spirit and scope of the invention.

What is claimed is:

1. A lateral MOS device formed in a body having a surface and comprising:
   a semiconductor layer, of a first conductivity type;
   a drain region of a second conductivity type, formed in the semiconductor layer and facing the surface;
   a source region of said second conductivity type, formed in the semiconductor layer and facing the surface;
   a channel of said first conductivity type, formed in the semiconductor layer between said drain region and said source region and facing said surface;
   an insulated gate region, formed over said surface and overlying said channel region; and
   a conductive region electrically isolated from the source region and extending only on one side of said insulated gate region, on top of said drain region, but not on top of said insulated gate region,
   wherein said conductive region extends longitudinally along said insulated gate region and ends with a widened contact portion encompassing projecting structures and extending between said projecting structures and said insulated gate region, the projecting structures each electrically coupled to a metallization layer.

2. The device according to claim 1, wherein said projecting structure comprises a plurality of projections arranged at a distance from one another, and said widened contact portion extends between said projections and is in electrical contact with a metal interconnection region.

3. A lateral MOS device formed in a body having a surface and comprising:
   a semiconductor layer, of a first conductivity type;
   a drain region of a second conductivity type, formed in the semiconductor layer and facing the surface;
   a source region of said second conductivity type, formed in the semiconductor layer and facing the surface;
   an insulated gate region, formed over said surface;
   a channel region of said first conductivity type, formed in the semiconductor layer between said drain region and said source region and facing said surface, said channel region underlying said gate region and substantially extending under the entire length of said gate region; and a conductive region extending only on one side of said insulated gate region, on top of said drain region, but not on top of said insulated gate region, and ending with a contact portion encompassing projecting structures electrically coupled to a metal layer, wherein said semiconductor layer has a resistive portion having a first doping level, said semiconductor layer further housing a body region of said first conductivity type, and a second doping level, higher than said first doping level, said body region extending adjacent to said drain region and over said resistive portion and under said gate region, forming said channel region and housing said source region; a dielectric material region, formed within said semiconductor layer, laterally and at a distance from said source region; and an enriched region, having said first conductivity type and a third doping level, higher than said first and second doping levels and extending between said resistive region and said dielectric material region.

4. The device according to claim 3, further comprising a substrate extending underneath said semiconductor layer, said substrate having said first conductivity type and a fourth doping level, greater than said first doping level, said enriched region extending between said surface and said substrate.

5. The device according to claim 1, wherein said drain region comprises a drain well, facing the surface, and a contact region, formed in said drain well and facing the surface, said drain contact region having a doping level greater than said drain well.

6. The device according to claim 1, wherein said insulated gate region comprises a gate electrode of electrically conductive material, the device further comprising:
a drain metal region extending on top of said semiconductor layer and electrically connected to said drain region;
a gate metal region extending on top of said semiconductor layer, at a distance from said drain metal region and electrically connected to said gate electrode; and
a source metal structure, distinct from said conductive region, extending on top of said semiconductor layer between said drain metal region and said gate metal region and electrically connected to said source region.

7. The device according to claim 6, wherein said drain metal region is in direct electrical contact with said drain region and wherein said source metal structure is in direct electrical contact with said source region and has at least one portion extending on top of said insulated gate region.

8. The device according to claim 6, wherein said drain metal region, said gate metal region, and said source metal structure extend on top of an insulating layer, said drain metal region being connected to said drain region through a drain contact structure extending through said insulating layer, and said source metal structure being connected to said source region through a source contact structure extending through said insulating layer and including a source metal contact region extending on top of said insulated gate region.

9. A transistor, comprising:
a first drain/source region having a first boundary;
a second drain/source region having a second boundary;
a body region having a portion disposed between and contiguous with the first and second boundaries, said portion having a single conductivity type;
a gate region having first and second sides and disposed over said body region, said first and second sides substantially aligned with said first and second boundaries, respectively;
an insulator layer disposed over the gate region; and
a conductive region adjacent to only one side of the gate region and disposed on the insulator layer and over the first drain/source region but not over the gate region, the conductive region further comprising holes formed by projecting structures extending through the conductive region and electrically coupled to a metallization layer.

10. The transistor of claim 9 wherein:
the gate region comprises a sidewall;
the insulator layer comprises a sidewall adjacent to the sidewall of the gate region; and
the conductive region is contiguous with the sidewall of the insulator layer.

11. An integrated circuit, comprising:
a transistor including,
a first drain/source region having a first boundary;
a second drain/source region having a second boundary;
a body region having a portion disposed between and contiguous with the first and second boundaries, said portion having a single conductivity type;
a gate region having first and second sides and disposed over said body region, said first and second sides substantially aligned with said first and second boundaries, respectively;
an insulator layer disposed over the gate region; and
a conductive region adjacent to only one side of the gate region and disposed on the insulator layer and over the first drain/source region but not over the gate region, the conductive region including projecting structures disposed through the conductive region and isolated from the conductive region by a dielectric.

12. The integrated circuit of claim 11, further comprising:
a portion of the insulator layer including trenches;
a portion of the conductive region disposed in the trenches; and
a contact over the trenches.

13. A system, comprising:
an integrated circuit including,
a transistor including,
a first drain/source region having a first boundary;
a second drain/source region having a second boundary;
a body region having a portion disposed between and contiguous with the first and second boundaries, said portion having a single conductivity type;
a gate region having first and second sides and disposed over said body region, said first and second sides substantially aligned with said first and second boundaries, respectively;
an insulator layer disposed over the gate region; and
a conductive region adjacent to only one side of the gate region and disposed on the insulator layer and over the first drain/source region but not over the gate region, the conductive region including projecting structures disposed through the conductive region and isolated from the conductive region by a dielectric.

14. A lateral MOS device comprising:
a semiconductor layer of a first conductivity type, said layer having a surface, a resistive region having a first doping level, a dielectric material region, and an enriched region, said enriched region extending between said resistive region and said dielectric material region and having said first conductivity type and a second doping level higher than said first doping level;
a drain region of a second conductivity type, disposed in the semiconductor layer and facing the surface, said drain region having a first boundary;

a source region of said second conductivity type, disposed in the semiconductor layer and facing the surface, said source region having a first boundary;

a body region of said first conductivity type and a third doping level higher than said first doping level but lower than said second doping level, said body region disposed in the semiconductor layer and over said resistive region and having a portion disposed between and contiguous with the first boundary of the source region and the first boundary of the drain region, said portion having a single conductivity type;

a gate region, disposed over said surface and overlying said body region, said gate region having a first side that is substantially aligned with the first boundary of said drain region, and a second side that is substantially aligned with the first boundary of said source region; and a conductive region extending only on one side of said gate region, over said drain region but not over said gate region, the conductive region including holes encompassed by the conductive region.

15. The device according to claim 1, wherein said conductive region is of a material chosen between polycrystalline silicon, silicide, tungsten, titanium nitride and a silicon/silicide composite material.

* * * * *